United States Patent [19]
Klein et al.

[11] Patent Number: 5,506,497
[45] Date of Patent: Apr. 9, 1996

[54] PROCESS AND DEVICE FOR MICROWAVE SURFACE RESISTANCE DETERMINATION

[75] Inventors: Norbert Klein, Remscheid; Ulrich Dähne, Aachen; Norbert Tellmann, Remscheid, all of Germany

[73] Assignee: Forschungszentrum Julich GmbH, Julich, Germany

[21] Appl. No.: 133,176

[22] PCT Filed: Feb. 9, 1993

[86] PCT No.: PCT/DE93/00105

§ 371 Date: Oct. 14, 1994

§ 102(e) Date: Oct. 14, 1994

[87] PCT Pub. No.: WO93/16393

PCT Pub. Date: Aug. 19, 1993

[30] Foreign Application Priority Data

Feb. 14, 1992 [DE] Germany .................... 42 04 369.7

[51] Int. Cl.$^6$ .................... G01N 27/00; G01R 27/26
[52] U.S. Cl. .................... 324/71.6; 324/636; 324/708; 333/219.1; 333/995; 505/726
[58] Field of Search .................... 324/633, 636, 324/637, 708, 71.6; 333/219.1, 995; 505/160, 161, 162, 210, 842, 843, 726

[56] References Cited

U.S. PATENT DOCUMENTS

| | | | |
|---|---|---|---|
| 4,968,945 | 11/1990 | Woskov et al. | 324/708 X |
| 5,105,158 | 4/1992 | Fiedziusko et al. | 333/219.1 X |
| 5,268,646 | 12/1993 | Doss | 324/633 |
| 5,379,110 | 1/1995 | Matsui et al. | 505/842 X |

FOREIGN PATENT DOCUMENTS 4004935  3/1994  WIPO ..................... 333/219.1

OTHER PUBLICATIONS

O. Llopis, "Microwave Characterization Of High Tc Superconductors With A Dielectric Resonator", Journal of the Less–Common Metals, 1990, pp. 1248–1251.

Zhi–Yaian Shen et al., "High Tc Superconductor–Sapphire Microwave Resonator With Extremely High Q–Values Up to 90K", 1992 IEEE MTT–S Digest, pp. 193–196.

Primary Examiner—Kenneth A. Wieder
Assistant Examiner—Diep Do
Attorney, Agent, or Firm—Herbert Dubno

[57] ABSTRACT

A process for determining a surface resistance to microwave energy of a superconductive film provides a metallic cavity resonator whose resonator cavity is defined by metallic walls, and positioning a superconductive film whose microwave surface resistance is to be measured as at least part of a wall of the cavity. A dielectric body is applied to a surface of the film and microwave energy is coupled to the cavity through an input antenna and microwave energy is coupled out of the cavity by an output antenna at which signals are produced as a measure of the microwave surface resistance of the film.

13 Claims, 2 Drawing Sheets

PROCESS AND DEVICE FOR MICROWAVE SURFACE RESISTANCE DETERMINATION

CROSS REFERENCE TO RELATED APPLICATION

This application is a national phase of PCT/DE93/00105 filed 9 Feb. 1993 and based upon German national application P 42 04 369.7 filed 14 Feb. 1992 under the International Convention.

FIELD OF THE INVENTION

The invention relates to a process for quality determination especially for determining the microwave surface resistance, of a single film formed on a substrate of a superconductive material, especially a high temperature superconductor, with the aid of an especially metallic cavity resonator with especially a circularly cylindrical interior. Further, the invention relates to a device for implementing such a process.

BACKGROUND OF THE INVENTION

Since the discovery of ceramic high temperature superconductors in 1986, the use of these materials has been demonstrated in, the field of passive microwave components as well as in the field of so-called Josephson components. Such passive microwave components from high temperature superconductive materials are of significance, among other things, for satellite communication. Practically all uses of this type make use of epitactic thin films of high temperature superconductive as have been produced in many laboratories throughout the world. One of the important criteria for the quality of such thin films is the microwave surface resistance. It constitutes a direct measure of the microwave losses in such components.

In the art there are basically two different processes described for the determination of the microwave surface resistance of a superconductive film.

It is known according to D. E. Oates, A. C. Anderson, and P. M. Mankiewich, *J. Supercond.* 3, 251, 1991, for example, to produce with the aid of photolithographic techniques planar resonators from the film to be investigated. Such measuring processes are expensive and are not suitable for rapid quality control of thin films.

An alternative kind of measuring process for determining the quality of such thin films is described in A. M. Portis, D. W. Cooke, and F. R. Gray, *J. Supercond.* 3, 297, 1991. In this measuring process, a wall of a metallic cavity resonator is formed by the thin film to be investigated. Such process requires no pretreatment of the probe and is thus suitable for quality control. This process, however, is suitable only for frequencies above 50 GHz. A process is known further from R. C. Taber, *Rev. Sci. Instrum.* 61, 2200, 1990, in which two superconductive films lying upon one another form a parallel-plate resonator. It is a disadvantage, however, that the average value of the surface resistance of two films is always measured. Aside from this, the total temperature curve of the surface resistance up to the break temperature cannot be determined.

OBJECT OF THE INVENTION

An object of the present invention is to provide an improved process and an apparatus for implementing the process which enables the quality control of individual thin films, especially of superconductive material with high sensitivity and without the drawbacks attributable to the state of the art.

SUMMARY OF THE INVENTION

This object is attained with a process in which the superconductive film is bonded of the cavity resonator as at least part of the wall of the resonator. The superconductive film is connected with a dielectric over a surface thereof. From an input antenna connected with the especially cylindrical wall, microwaves are coupled into the interior of the cavity resonator and a further output antenna, which can be disposed opposite the input antenna, is connected with the resonator to carry out signals from the interior of the resonator. The so outputted signals are further processed in a known manner, especially to determine the microwave surface resistance of the superconductive film. The quality determination of the superconductive film can, however, also reside in a processing of the outputted microwave signal to determine the penetration depths of the magnetic field. The superconductive film is preferably a high temperature superconductor.

By contrast with known cavity resonator processes the process according to the invention provides that the cavity is in part filled with a dielectric which not only shortens the measurements of the cavity but also enables measurements at lower frequencies. A further advantage of the process according to the invention resides in the amplification of the electromagnetic field at the firm surface as a result of the surface adhesion contact of the dielectric with the superconductive field. A weakening of this electromagnetic field at the remaining walls of the reactor is thus achieved in an advantageous manner.

Advantageously, when the superconductive film forms a part of the lower wall of the resonator, the dielectric loosely rests on this film.

It suffices for the purpose of coupling the electromagnetic field to the superconductive film that the dielectric can be loosely set on this film. This feature allows a quality determination of the superconductive film without damage thereto. A further advantage of this feature can reside in the fact that the quality determinations can be effected one after another at different locations of the superconductive film to be investigated by simple shifting of the dielectric.

It is especially advantageous to select as the dielectric, sapphire or lanthanum illuminate ($LaAlO_3$) It is self understood that other materials can be selected as dielectrics as well. They should, like for example, the sapphire described here, belong to the class of dielectrics with high dielectric constant but reduced dielectric losses. Advantageously, with the choice of a material with a higher dielectric constant, there is an increase in the concentration of the electromagnetic field at the superconductor film surface and therewith an associated weakening of such electromagnetic field at the remaining walls of the cavity resonator.

It is advantageous to select as the geometric shape of the dielectric, a cylinder.

For the further processing of the microwave signal radiated from the output antenna and for the determination of the surface resistance $R_{Film}(T)$, with the following relationship can be used for a cavity resonator with a resonance frequency f, between the quality factor Q, the surface resistance of the film $R^{Film}(T)$, the surface resistance of the resonator material $R^{Cu}(T)$, especially copper, and the two geometry factors, $G_{Film}$ and $G_{Resonator}$ $$\frac{1}{Q} = \frac{R^{Film}(T)}{G_{Film}} + \frac{R^{Cu}(T)}{G_{Resonator}}.$$

As a preliminary to determining the surface resistance $R_{Film}(T)$ of the superconductive film a determination via two reference measurements of the geometry factor $G_{Resonator}$ as well as the temperature dependency curve of the surface resistance $R^{Cu}$ of the cavity resonator is required.

In a first reference measurement, initially the term $R^{cu}$ (2K) divided by $G_{Resonator}$ is determined. Advantageously for this, a substrate provided with a niobium film can be introduced. Aside from niobium, other materials can be selected with a temperature of T=2K as long as the surface resistance of such materials at this temperature is small by comparison to the resistance of the superconductive film to be investigated.

In a further, second reference measurement, the temperature dependence of the term $R^{Cu}(T)$ divided by $G_{Resonator}$ is detected so that the geometry factor $G_{Film}$ of the superconductive film can be determined.

From the equation $$Q(T) = \frac{F}{\delta f_{1/2}}$$

the quality factor Q(t) in dependence upon the temperature can be detected from the evaluation of the half-value width $\delta f_{1/2}$ of the measured resonance curve.

In the apparatus aspect of the invention, an apparatus for implementing a process as described can comprise a metallic cavity resonator with a cylindrical interior in whose, especially cylindrical walls a first antenna is provided for the coupling of microwaves into the resonator and a further antenna is provided for the coupling of microwaves and determining the microwave surface resistance of the superconductive film. The hollow resonator has at one of the other walls bonding the interior, especially at the end face of the circularly cylindrical interior, an opening in which the substrate bonded with the superconductive film is so disposed that the film outside the inner space forms the wall of the resonator and the film coated side of the substrate is turned toward the inner wall of the resonator and a dielectric at least partly covers the superconductive film.

In this apparatus a cylindrical dielectric can lie in surface contact with the superconductive film with its base surface. The dielectric can be comprised of sapphire or $LaAlO_3$. The material forming the cavity resonator can be niobium. The input antenna can be arranged opposite the output antenna. An especially advantageous embodiment of the apparatus of the invention is given when the material for forming the cavity resonator is provided as niobium. By comparison with a cavity resonator, for example, from copper, the cavity resonator whose inner walls are comprised of niobium gives a further reduction in the microwave losses of the cavity resonator.

BRIEF DESCRIPTION OF THE DRAWING

The above and other objects and features and advantages will become more readily apparent from the following description, reference being made to the accompanying drawing in which.

SPECIFIC DESCRIPTION

Figure 1:
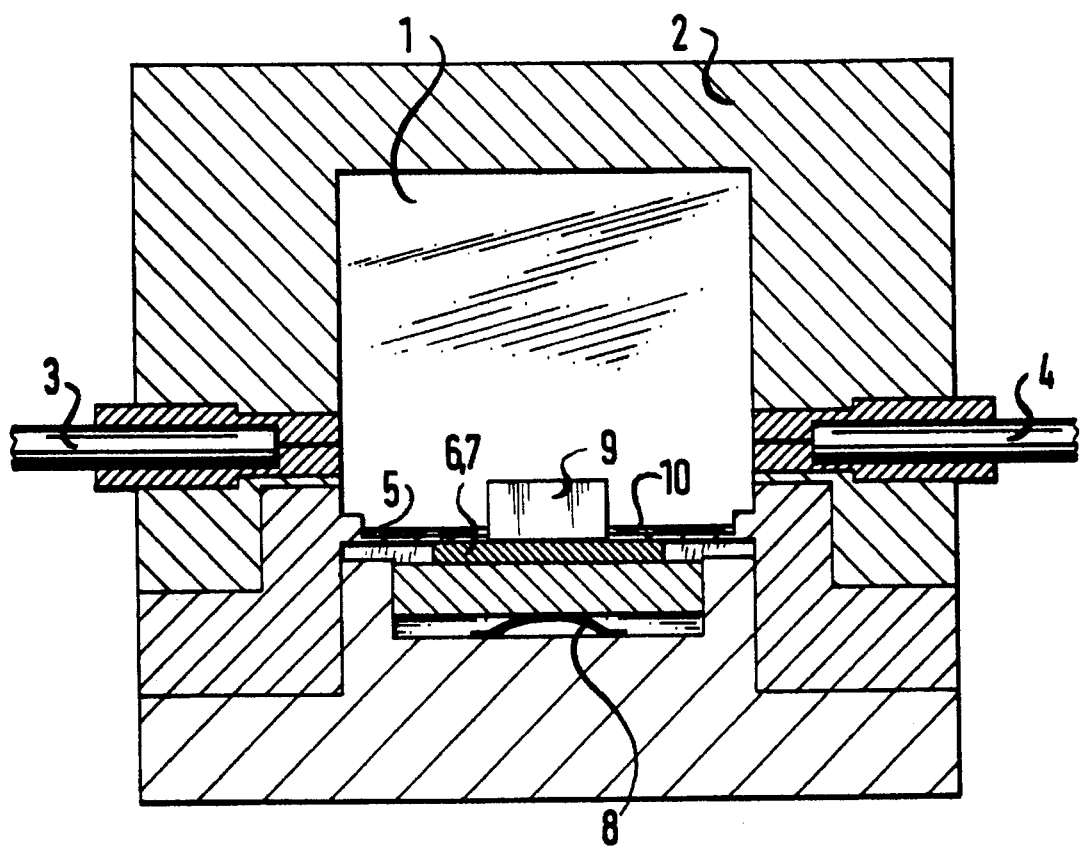
FIG. 1 is a cross sectional view through an apparatus of the invention.
Figure 2:
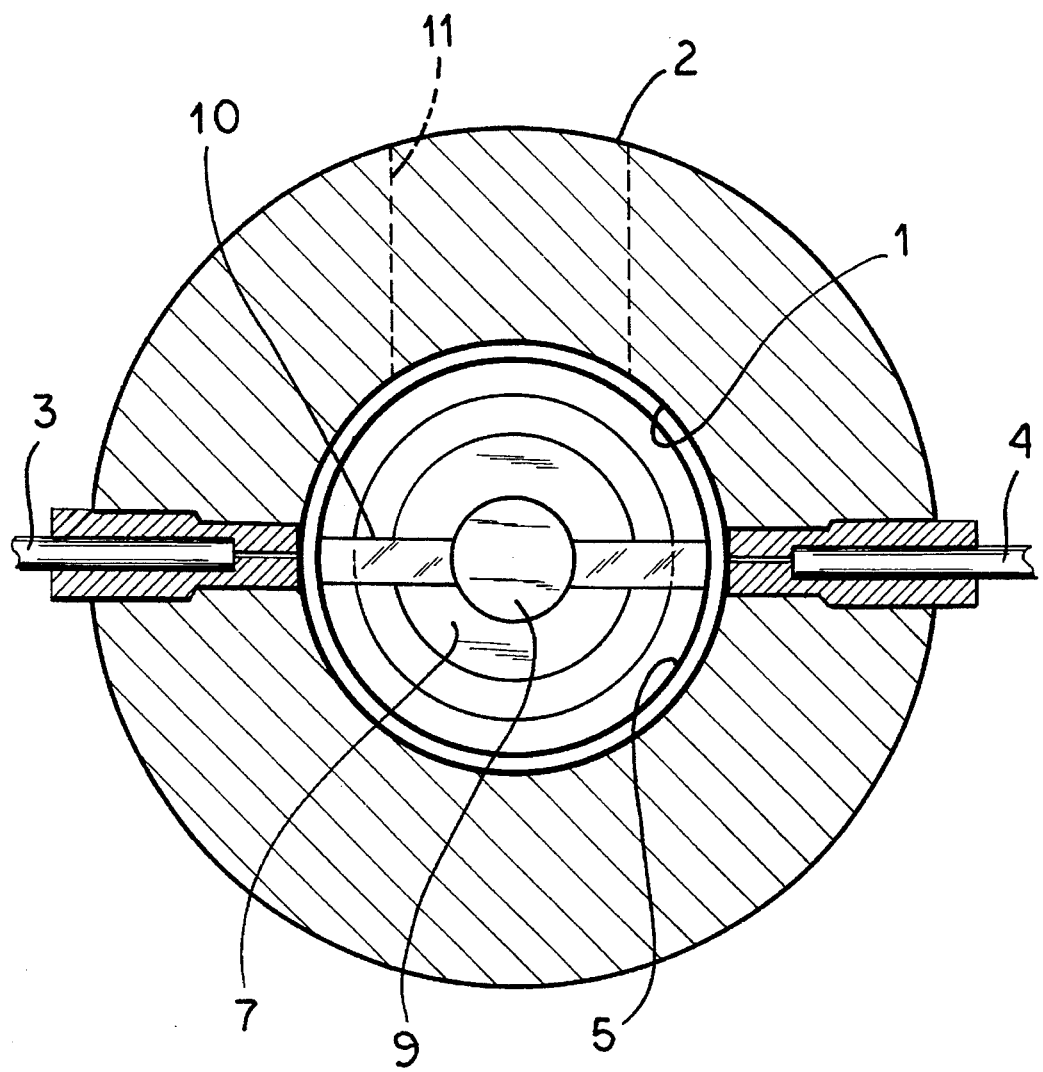
FIG. 2 is a transverse section therethrough.

In the interior 1 of the cavity resonator 2 composed of copper are inserted an input antenna 3 as well as an output antenna 4. At an opening 5 of the wall of the interior 1 of the cavity resonator 2, a superconductive film 7 bonded to a substrate 6 is fed from outside the interior through passage 11 (see FIG. 2) to the opening 5. Advantageously, a spring 8 serves for the positioning of the film during the quality determination. On the superconductive film 7 to be investigated, lies the cylindrical dielectric a composed of sapphire and in surface contact to the superconductive film 7. As the illustration in FIG. 1 shows it is advantageous that the dielectric having its end face lying on the film, is suitably formed with a holder 10 composed of quartz that positions the dielectric 9 relative to the film to be investigated and laterally defines its relative position.

In a known manner, the input of microwaves is effected with the aid of the input antenna 3. The microwave signal is outputted for the purpose of further processing by the output antenna from the interior.

At a resonance of 18.7 GHz, a sensitivity in the determination of the microwave surface resistance of the film to be investigated of $\pm 5 \times 10^{-5}$ Ohm is achieved.

The process according to the invention and the apparatus for carrying out this process according to the invention allow the characterization of individual superconductive films whose diameters have a value from 0.5 cm up to 3 cm, for example, 1 cm or 2 cm. With this process, superconductive films with surface resistances up to values of 2 Ohm can be measured.

When arranged in a cryostat, the subject of the invention allows the determination of microwave surface resistance of superconductive films in a temperature range of 2K up to 300K. It is selfunderstood that such an arrangement is not limited to this temperature range. The cylinder shape of the dielectric comprised of sapphire has a diameter of 6 mm and a height of 3 mm. The interior of the cavity resonator in FIG. 1 is 1.5 cm in height and 2.0 cm in diameter. The given extreme values for surface resistance, temperature and dimensions, however, should not be considered as limitations. Far more, the process can be utilized for values other than those given here.

We claim:

1. A process for determining a microwave surface resistance of a superconductive film, comprising the steps of:
   (a) providing a metallic cavity resonator having a closed resonator cavity defined by metallic walls and a further wall formed by a superconductive film whose microwave surface resistance is to be measured so that said metallic walls and said film fully enclose said cavity, said superconductive film being provided on a substrate supporting said film in an opening in one of said metallic walls;
   (b) applying a dielectric to a surface of said film;
   (c) from an input antenna connected to said resonator, coupling microwave energy into said cavity so that microwave energy is concentrated in said film and weakened at said metallic walls; and
   (d) coupling microwave energy out of said cavity by an output antenna, thereby producing signals which are a measure of a microwave surface resistance of said film.

2. The process defined in claim 1 wherein said film is positioned in said opening as a lower wall of said cavity, said dielectric resting upon said film.

3. The process defined in claim 1 wherein said dielectric is sapphire or $LiAlO_3$.

4. The process defined in claim 1 wherein said dielectric is of cylindrical shape.

5. The process defined in claim 1 wherein the input antenna is disposed opposite the output antenna.

6. The process defined in claim 1 wherein said superconductive film is a film of a high-temperature superconductor.

7. The process defined in claim 6 wherein said film is a YBaCuO superconductor.

8. An apparatus for determining a microwave surface resistance of a superconductive film, comprising:

a metallic cavity resonator having a resonator cavity defined by metallic walls, one of said metallic walls having an opening;

means for positioning a superconductive film whose microwave surface resistance is to be measured and provided on a substrate in said opening to form another wall of said cavity, said metallic walls and said film completely enclosing said cavity;

a dielectric disposed against a surface of said film;

an input antenna connected to said resonator and coupling microwave energy into said cavity so that microwave energy is concentrated in said film and weakened at said metallic walls; and means for coupling microwave energy out of said cavity and including an output antenna producing signals which are a measure of a microwave surface resistance of said film.

9. The apparatus defined in claim 8 wherein said cavity is cylindrical, said film forms a bottom wall of said cavity and said dielectric rests on said film from above.

10. The apparatus defined in claim 9 wherein said dielectric is a cylinder.

11. The apparatus defined in claim 8 wherein said dielectric is composed of sapphire or $LiAlO_3$.

12. The apparatus defined in claim 8 wherein the metal of said resonator is copper or niobium.

13. The apparatus defined in claim 8 wherein said film is composed of a high-temperature superconductor.

\* \* \* \* \*